(12) United States Patent
Yang et al.

(10) Patent No.: US 9,529,133 B2
(45) Date of Patent: Dec. 27, 2016

(54) LED DEVICE, LIGHT GUIDE PLATE AND BACKLIGHT MODULE

(71) Applicants: BOE Technology Group Co., Ltd., Beijing (CN); Beijing BOE Optoelectronics Technology Co., Ltd., Beijing (CN)

(72) Inventors: Jiuxia Yang, Beijing (CN); Feng Bai, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 39 days.

(21) Appl. No.: 14/801,932

(22) Filed: Jul. 17, 2015

(65) Prior Publication Data

US 2016/0146999 A1   May 26, 2016

(30) Foreign Application Priority Data

Nov. 26, 2014   (CN) .............................. 201410697125

(51) Int. Cl.
*H01L 33/50* (2010.01)
*F21V 8/00* (2006.01)
*C09K 11/74* (2006.01)

(52) U.S. Cl.
CPC ......... *G02B 6/0003* (2013.01); *C09K 11/7492* (2013.01); *G02B 6/005* (2013.01); *G02B 6/0073* (2013.01); *H01L 33/502* (2013.01)

(58) Field of Classification Search
CPC ...... H01L 33/50; H01L 33/502; H01L 33/504; G02B 6/0026

(Continued)

(56) References Cited

U.S. PATENT DOCUMENTS 6,501,091 B1 * 12/2002 Bawendi ................ B82Y 10/00
                                                              257/100
7,227,190 B2   6/2007 Yasukawa et al.
(Continued)

FOREIGN PATENT DOCUMENTS

CN        1682381 A    10/2005
CN     101154699 A     4/2008
(Continued)

OTHER PUBLICATIONS

First Office Action for Chinese Patent Application No. 201410697125.4, dated Aug. 18, 2016, 19 pages.

*Primary Examiner* — Karabi Guharay
(74) *Attorney, Agent, or Firm* — Westman, Champlin & Koehler, P.A.

(57) ABSTRACT

Embodiments of the present disclosure provide a LED device, a light guide plate and a backlight module, which are capable of generating red light, green light and blue light under excitation of ultraviolet light, and reducing damages of human eyes due to blue light by attenuating or eliminating light intensity of the blue light having a wavelength of 460 nm. The LED device comprises an ultraviolet illuminant and a quantum dot film located on a light emitting side of the ultraviolet illuminant. The quantum dot film includes a quantum dot material capable of generating the red light, the green light and the blue light under excitation of ultraviolet light. The wavelength of the generated blue light is within a wave band of 450~470 nm, and a wave crest of the generated blue light is located within the wave band excluding 460 nm.

17 Claims, 3 Drawing Sheets

(58) Field of Classification Search
USPC ............................................... 257/98; 362/84
See application file for complete search history.

(56) References Cited

U.S. PATENT DOCUMENTS

| | | | | |
|---|---|---|---|---|
| 8,455,898 | B2* | 6/2013 | Anc | ...................... H01L 33/504 |
| | | | | 257/98 |
| 2011/0303940 | A1* | 12/2011 | Lee | ......................... H01L 33/54 |
| | | | | 257/98 |
| 2014/0334181 | A1* | 11/2014 | Hu | ...................... G02B 6/0023 |
| | | | | 362/608 |
| 2015/0062967 | A1* | 3/2015 | Bae | ...................... G02B 6/0096 |
| | | | | 362/610 |
| 2015/0171290 | A1 | 6/2015 | Lee et al. | |

FOREIGN PATENT DOCUMENTS

| | | |
|---|---|---|
| CN | 102280565 A | 12/2011 |
| CN | 103343943 A | 10/2013 |
| CN | 103430337 A | 12/2013 |
| CN | 103904198 A | 7/2014 |

\* cited by examiner

LED DEVICE, LIGHT GUIDE PLATE AND BACKLIGHT MODULE

CROSS-REFERENCE TO RELATED APPLICATION

This application claims the benefit of Chinese Patent Application No. 201410697125.4 filed on Nov. 26, 2014 in the State Intellectual Property Office of China, the whole disclosure of which is incorporated herein by reference.

BACKGROUND OF THE INVENTION

Field of the Invention

Embodiments of the present disclosure generally relate to the field of display technologies, and particularly, to an LED device, a light guide plate and a backlight module.

Description of the Related Art

In prior arts, white light generated by LED (Light Emitting Diode) is mainly obtained by a blue light chip that is added yellow phosphor powder therein. The wavelength and wave crest of blue light in the generated white light concentrate at a wavelength of 460 nm which is harmful for human eyes.

Currently, problems caused by blue light of electronic products have been given enough attention in the industry. Experiments show that it is very likely to cause senile macular degeneration if excessively exposed to the blue light. Thus, it is being considered to classify and limit the blue light from LED light sources.

SUMMARY OF THE INVENTION

Embodiments of the present disclosure provide an LED device, a light guide plate and a backlight module, which are capable of generating red light, green light and blue light under excitation of ultraviolet light, and reducing damages of human eyes due to blue light by attenuating or eliminating light intensity of the blue light having a wavelength of 460 nm.

According to a first aspect of the present disclosure, there is provided an LED device, comprising an ultraviolet illuminant and a quantum dot film located on a light emitting side of the ultraviolet illuminant; the quantum dot film includes quantum dot materials capable of generating red light, green light and blue light under excitation by ultraviolet light; the wavelength of the generated blue light is within a wave band of 450~470 nm, and a wave crest of the generated blue light is located within the wave band excluding 460 nm.

According to a second aspect of the present disclosure, there is further provided a backlight module, comprising the above LED device and a light guide plate; wherein the red light, green light and blue light generated by quantum dot film under excitation of ultraviolet light emitted by the ultraviolet illuminant of the LED device are mixed into white light, and the light guide plate is configured to homogenize the white light from the LED device, thereby forming a surface light source.

According to a third aspect of the present disclosure, there is further provided a light guide plate, comprising a body and quantum dot particles distributed within the body; the quantum dot particles include quantum dot materials that are capable of generating red light, green light and blue light under excitation by ultraviolet light; the red light, green light and blue light generated by quantum dot particles under excitation by ultraviolet light are mixed into white light; the wavelength of the generated blue light is within a wave band of 450~470 nm, and a wave crest of the generated blue light is located within the wave band excluding 460 nm.

According to a fourth aspect of the present disclosure, there is further provided a backlight module, comprising the above light guide plate and an ultraviolet illuminant.

According to a fifth aspect of the present disclosure, there is further provided a backlight module, comprising an ultraviolet illuminant, a light guide plate and an optical film sheet; the backlight module further comprises a quantum dot film located on a surface of the light guide plate or a surface of the optical film sheet; the quantum dot film includes quantum dot materials that are capable of generating red light, green light and blue light under excitation by ultraviolet light; the red light, green light and blue light generated by quantum dot film under excitation by ultraviolet light emitted from the ultraviolet illuminant are mixed into a white light; and the wavelength of the generated blue light is within a wave band of 450~470 nm, and a wave crest of the generated blue light is located within the wave band excluding 460 nm.

According to a sixth aspect of the present disclosure, there is further provided a display device, comprising the above backlight module.

In the LED device, the light guide plate, the backlight module and the display device provided according to the embodiments of the present disclosure, the quantum dot film or particles include a quantum dot materials that are capable of generating red light, green light and blue light under excitation of ultraviolet light, wherein the wavelength of the generated blue light is within a wave band of 450~470 nm, and a wave crest of the generated blue light is located within the wave band excluding 460 nm.

Based on the above, red light, green light and blue light may be generated by quantum dot materials under excitation of ultraviolet light. Further, blue light with a wave crest within a wave band excluding 460 nm may be obtained by selecting a specific quantum dot material that is capable of generating a blue light under excitation of ultraviolet light and by controlling particle size distribution of the quantum dots, thereby effectively attenuating or even eliminating the light intensity of the blue light having the wavelength of 460 nm, reducing damages of human eyes due to blue light and achieving a health design for electronic products.

BRIEF DESCRIPTION OF THE DRAWINGS

In order to describe embodiments of the present invention or technical solutions in the prior art more clearly, accompanying drawings required for illustrating the embodiments or the prior art will be simply explained as below. Apparently, the accompanying drawings for the following description are only some embodiments of the present invention. Those skilled in the art also could derive other accompanying drawings from these accompanying drawings without making a creative work.

REFERENCE NUMBERS

Figure 1:
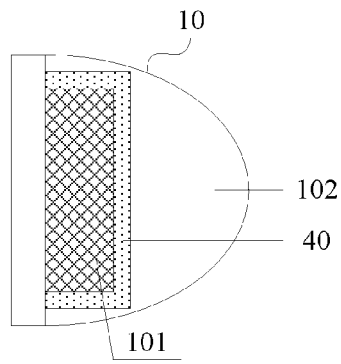
FIG. 1 is a schematic structural diagram of an LED device according to one embodiment of the present disclosure.

10—LED device; 101—ultraviolet illuminant; 102—lampshade; 20—light guide plate; 201—body; 202—quantum dot particles; 30—ultraviolet illuminant; 40—quantum dot film; 50—optical film sheet; 60—reflective film.

DETAILED DESCRIPTION OF PREFERRED EMBODIMENTS OF THE INVENTION

Exemplary embodiments of the present disclosure will be described hereinafter in detail with reference to the attached drawings. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
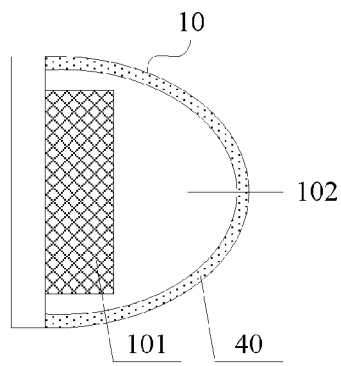
FIG. 2 is a schematic structural diagram of an LED device according to another embodiment of the present disclosure.

An LED device 10 provided according to an embodiment of the present disclosure, as shown in FIG. 1 and FIG. 2, comprises an ultraviolet illuminant 101 and a quantum dot film 40 located on a light emitting side of the ultraviolet illuminant 101; the quantum dot film 40 includes quantum dot materials capable of generating red light, green light and blue light under excitation of ultraviolet light; wherein the wavelength of the generated blue light is within a wave band of 450~470 nm, and a wave crest of the generated blue light is located within the wave band excluding 460 nm. In one example, the ultraviolet illuminant may be an ultraviolet light chip or an ultraviolet light LED.

It is noted that firstly, the light emitting side of the ultraviolet illuminant 101 is a light emitting side of the ultraviolet illuminant 10 which emits ultraviolet light; on the basis of this, "quantum dot film 40 located on a light emitting side of the ultraviolet illuminant 101" means that the quantum dot film 40 is arranged in a propagation path of the ultraviolet light, so that red light, green light and blue light are generated by the quantum dot film 40 under excitation of the ultraviolet light.

Secondly, the quantum dot film 40 comprises materials capable of generating light of different colors under excitation of ultraviolet light. In embodiments of the present disclosure, specifically, quantum dot materials may comprises a quantum dot material capable of generating red light under excitation of ultraviolet light (hereafter called as red light quantum dot material), a quantum dot material capable of generating green light under excitation of ultraviolet light (hereafter called as green light quantum dot material), and a quantum dot material capable of generating blue light under excitation of ultraviolet light (hereafter called as blue light quantum dot material).

Based on the above, after selecting particular quantum dot materials, light of different wavelengths can be correspondingly generated by controlling particle sizes of the quantum dot materials. In embodiments of the present disclosure, multi-waveband blue light is formed mainly by controlling particle sizes of the quantum dot materials so that the wavelength of the blue light generated by the quantum dot materials under excitation of ultraviolet light is distributed in a range of 450~470 nm, and a wave crest of the blue light is located away from 460 nm.

Thirdly, the red light, green light and blue light generated by the quantum dot film 40 under excitation of ultraviolet light are controlled in proportion so that they are mixed into white light; wherein the generated blue light according to embodiments of the present disclosure has a weaker light intensity at the wavelength of 460 nm, but can be compensated by blue light at other wavelengths so as to be mixed with the red light and green light to form the white light.

Figure 3:
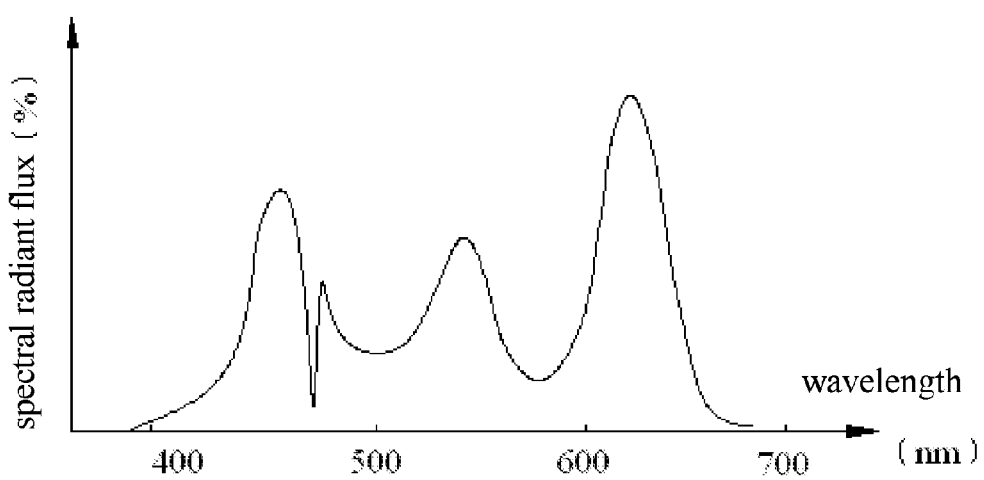
FIG. 3 is a spectral curve generated by a quantum dot material excited by ultraviolet light according to an embodiment of the present disclosure.

Based on the above, as shown in FIG. 3, the red light, green light and blue light are generated by quantum dot materials under excitation of ultraviolet light; a blue light with a wave crest within a wave band excluding 460 nm may be obtained by selecting a specific quantum dot material that is capable of generating a blue light under excitation of ultraviolet light and controlling particle size distribution of the quantum dot material, thereby effectively attenuating or even eliminating the light intensity of the blue light having the wavelength of 460 nm, reducing damages of human eyes due to the blue light and achieving a health design for electronic products.

Preferably, the wavelength of the blue light generated by the quantum dot film 40 under excitation of the ultraviolet light emitted from the ultraviolet illuminant 101 is within a range of 450~470 nm and does not involve a wave band of 458~462 nm. As such, by eliminating the blue light within the wave band of 458~462 nm, damages of human eyes due to blue light can be reduced to the utmost extent, thereby forming a health light source.

The quantum dot film 40 may be a single-layered film, which includes quantum dot materials capable of respectively generating red light, green light and blue light under excitation of an ultraviolet light.

As such, the red light quantum dot material, the green light quantum dot material and the blue light quantum dot material are mixed uniformly to form the quantum dot film 40, so that not only homogeneous light can be generated when being emitted from the quantum dot film 40, but also the single-layered film has a relatively small thickness and has a relatively limit adverse influence on light transmittance, contributing to obtain homogeneous and high bright light.

Alternatively, the quantum dot film 40 may includes overlapped three layers, Each of the three layers includes one of quantum dot materials that are capable of respectively generating red light, green light and blue light under excitation of ultraviolet light, and light generated by the quantum dot materials of the three layers of films are different from one another.

Based on the above, a quantum dot film capable of generating red light under excitation of ultraviolet light is formed by the red light quantum dot material, a quantum dot film capable of generating green light under excitation of ultraviolet light is formed by the green light quantum dot material, a quantum dot film capable of generating blue light under excitation of ultraviolet light is formed by the blue light quantum dot material, and the formed three quantum dot films are arranged to overlap on one another. As such, when ultraviolet light passes through the above three layers in turn, the quantum dot materials are sequentially excited to respectively generate the red light, the green light and the blue light, which are mixed with together so that light of various colors may be formed.

It is noted that the quantum dot film formed by the red light quantum dot material, the quantum dot film formed by the green light quantum dot material and the quantum dot film formed by the blue light quantum dot material are arranged to overlap on one another, and the stacking sequence of the three quantum dot film is not limited here.

In the following, selection and configuration of the blue light quantum dot material is specifically describe in connection with several blue light quantum dot materials, and the wavelengths of the blue light generated the blue light quantum dot material s with corresponding particle sizes.

Firstly, cadmium telluride (CdTe) quantum dot material is capable of generating blue light under excitation of ultraviolet light; when the particle size of the CdTe quantum dot material is within a range 6~12 nm, the wave band of the blue light generated by the CdTe quantum dot material has a range of 446~462 nm.

Specifically, the wavelength of the generated blue light is 446 nm when the particle size of the CdTe quantum dot material is 6 nm; the wavelength of the generated blue light is 455 nm when the particle size of the CdTe quantum dot material is 9 nm; and the wavelength of the generated blue light is 462 nm when the particle size of the CdTe quantum dot material is 12 nm.

Based on the above, when the CdTe quantum dot material is used as the blue light quantum dot material, for example, the particle size of the CdTe quantum dot material may be selected to fall within a range of 6~10 nm or a range of greater than 12 nm, thereby avoiding generating the blue light within the wave band of 458~462 nm as far as possible.

Secondly, zinc selenide (ZnSe) quantum dot material is capable of generating blue light under excitation of ultraviolet light; when the particle size of the ZnSe quantum dot material is within a range 10~19 nm, the wave band of the blue light generated by the ZnSe quantum dot material has a range of 450~469 nm.

Specifically, the wavelength of the generated blue light is 450 nm when the particle size of the ZnSe quantum dot material is 10 nm; the wavelength of the generated blue light is 460 nm when the particle size of the ZnSe quantum dot material is 16 nm; and the wavelength of the generated blue light is 469 nm when the particle size of the ZnSe quantum dot material is 19 nm.

Based on the above, when the ZnSe quantum dot material is used as the blue light quantum dot material, for example, the particle size of the ZnSe quantum dot material may be selected to fall within a range of 10~15 nm or a range of 17~19 nm, thereby avoiding generating the blue light within the wave band of 458~462 nm as far as possible.

Thirdly, gallium arsenide (GaAs) quantum dot material is capable of generating blue light under excitation of ultraviolet light; when the particle size of the GaAs quantum dot material is within a range 15~18 nm, the wave band of the blue light generated by the GaAs quantum dot material has a range of 453~464 nm.

Specifically, the wavelength of the generated blue light is 453 nm when the particle size of the GaAs quantum dot material is 15 nm; and the wavelength of the generated blue light is 464 nm when the particle size of the GaAs quantum dot material is 18 nm.

Based on the above, when the GaAs quantum dot material is used as the blue light quantum dot material, for example, the particle size of the GaAs quantum dot material may be selected to fall within a range of 15~18 nm, thereby avoiding generating the blue light within the wave band of 458~462 nm as far as possible.

Based on the above exemplary embodiments, it is noted that on one hand, as different kinds of quantum dot materials have different ranges of particle size for generating blue light under excitation of ultraviolet light, a suitable kind of quantum dot material may be selected by considering its particular range of particle sizes; on the other hand, as the same kind of quantum dot materials will generate blue light of different wavelengths at different particle sizes under excitation of ultraviolet light, the particle size of a particular quantum dot material may be controlled in order to reduce or eliminate the light intensity of blue light of 460 nm.

Further, in embodiments of the present disclosure, the quantum dot materials for forming the quantum dot film 40 may include the same kind of quantum dot materials which have different particle sizes, or may include mixed materials of a plurality of materials, which is not limited here.

Of course, it is appreciated that the above several specific materials are provided only for describing embodiments of the present disclosure, and the quantum dot material capable of generating blue light under excitation of ultraviolet light are not limited to those; any implementation, in which particular quantum dot material(s) is suitably selected and the particle size thereof is controlled so as to control the wave band of the blue light to be generated, will fall within the scope of the present invention.

In one example, with reference to FIG. 1, the quantum dot film 40 may be arranged on a surface of the ultraviolet illuminant 10. Alternatively, with reference to FIG. 2, the LED device 10 may further comprise a lampshade 102 covering the ultraviolet illuminant 101, and the quantum dot film 40 may be arranged on a surface of the lampshade 102.

Here, the quantum dot film 40 may be in the form of the above single-layered film, or in the form of overlapped three layers, as long as the quantum dot film 40 can uniformly spread over a flat surface or a curved surface on the light emitting side of the ultraviolet illuminant 101.

An embodiment of the present disclosure further provides a backlight module, comprising the above LED device 10 and a light guide plate; wherein the red light, green light and blue light generated by the 40 under excitation by ultraviolet light of the ultraviolet illuminant of the LED device 10 are mixed into a white light, and the light guide plate is configured to homogenize the white light from the LED device 10, thereby forming a surface light source.

As such, the white light emitted by the LED device 10 is formed by uniformly mixing the red light, the green light and the blue light, and a wave crest of the generated blue light is located within a blue light wave band excluding 460 nm, thereby effectively attenuating or even eliminating the light intensity of the blue light having the wavelength of 460 nm; when the backlight module is applied in a liquid crystal display device, damages of human eyes due to blue light can be reduced, achieving a health design for display products.

On the basis of the above, the quantum dot film 40 is arranged in the LED device 10, so that homogeneous white light can be formed before entering the light guide plate, which facilitates homogenization of light within the light guide plate, thereby enabling a homogeneous surface light source.

Figure 4:
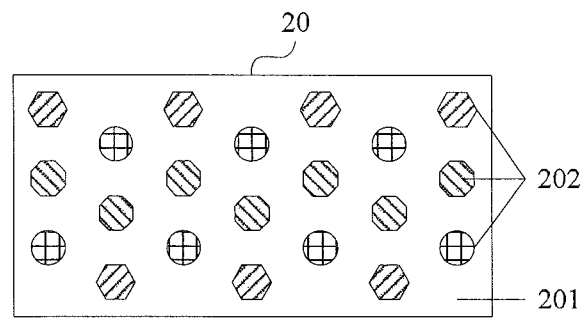
FIG. 4 is a schematic structural diagram of a light guide plate according to an embodiment of the present disclosure.

An embodiment of the present disclosure further provides a light guide plate 20, as shown in FIG. 4, comprising a body 201 and quantum dot particles 202 distributed within the body 201; materials for forming the quantum dot particles 202 include quantum dot materials capable of generating red light, green light and blue light respectively under excitation by ultraviolet light; the red light, green light and blue light generated by quantum dot particles under excitation by ultraviolet light are mixed into white light; wherein the wavelength of the generated blue light is within a wave band of 450~470 nm, and a wave crest of the generated blue light is located within the wave band excluding 460 nm.

It is noted that both optical network points and the quantum dot particles 202 are distributed within the body 201; wherein the quantum dot particles 202 are uniformly doped within the body 201, and particle sizes of the quantum dot particles 202 may be selected depending on particular quantum dot materials, as long as the blue light having a wavelength of 460 nm can be attenuated or eliminated.

As such, the quantum dot particles 202 are uniformly doped within the body 201, such that red light, green light and blue light are generated by these quantum dot particles 202 under excitation of ultraviolet light and are uniformly mixed within the light guide plate 20 so as to form homogeneous white light, which is emitted from a light emitting face of the light guide plate 20.

On the basis of the above, the wavelength of the blue light generated by the quantum dot particles 202 under excitation of ultraviolet light is within a range of 450~470 nm, and does not involve a wave band of 458~462 nm. As such, the blue light within the wave band of 458~462 nm is eliminated so that damages of human eyes due to blue light can be reduced to the utmost extent.

Figure 5:
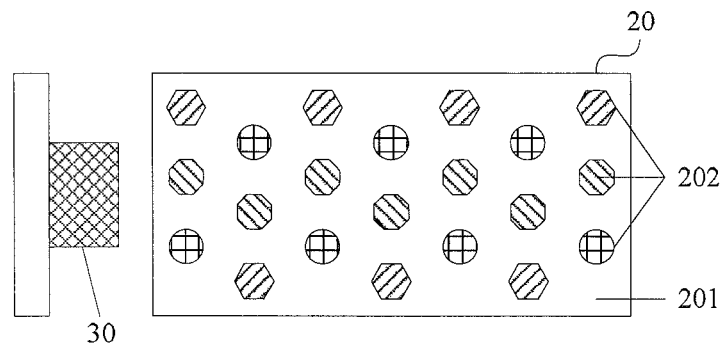
FIG. 5 is a schematic structural diagram of a backlight module according to an embodiment of the present disclosure.

An embodiment of the present disclosure further provides a backlight module, as shown in FIG. 5, comprising the above light guide plate 20 and an ultraviolet illuminant 30.

Here, the ultraviolet illuminant may be an ultraviolet light LED or an ultraviolet light CCFL (Cold Cathode Fluorescent Lamp).

Based on the above, the ultraviolet light emitted from the ultraviolet illuminant 30 enters the light guide plate 20, and a red light, a green light and a blue light are generated by quantum dot particles 202 within light guide plate 20 under excitation of the ultraviolet light, then are uniformly and sufficiently mixed into white light within the light guide plate 20 so as to be converted into a white light, which is emitted from the light emitting face of the light guide plate 20; wherein materials and particle sizes of the quantum dot particles 202 are appropriately selected, so that the wave crest of the generated blue light is located within a blue light wave band excluding at 460 nm, thereby attenuating or even eliminating the light intensity of the blue light having the wavelength of 460 nm and reducing damages of human eyes due to blue light, achieving a health design for display products.

On the basis of the above, with the quantum dot particles 202 doped within the light guide plate 20, light of different colors can be formed and mixed within the light guide plate 20, obtaining a homogeneous surface light source.

Figure 6:
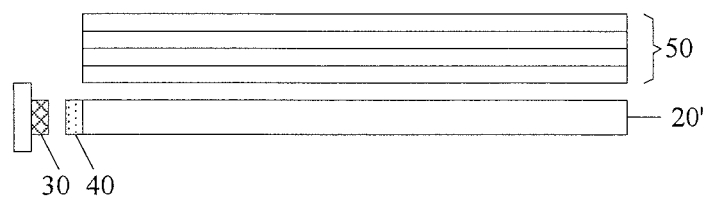
FIG. 6 is a schematic structural diagram of a backlight module according to another embodiment of the present disclosure.
Figure 7:
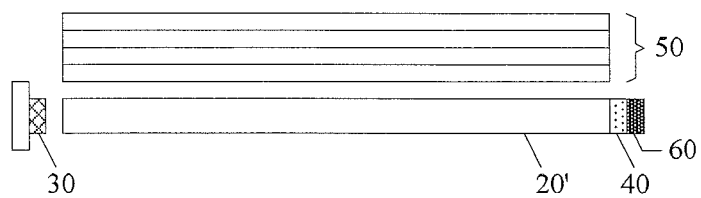
FIG. 7 is a schematic structural diagram of a backlight module according to a further embodiment of the present disclosure.
Figure 8:
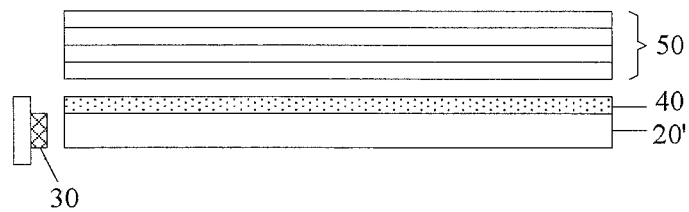
FIG. 8 is a schematic structural diagram of a backlight module according to a still further embodiment of the present disclosure.

An embodiment of the present disclosure further provides a backlight module, as shown in FIG. 6 to FIG. 8, comprising an ultraviolet illuminant 30, a light guide plate 20 and an optical film sheet 50; the backlight module further comprises a quantum dot film 40 located on a surface of the light guide plate 20 or a surface of the optical film sheet 50; wherein, the quantum dot film 40 includes quantum dot materials capable of respectively generating red light, green light and blue light under excitation of ultraviolet light; the red light, the green light and the blue light generated by the quantum dot film 40 under excitation of ultraviolet light emitted from the ultraviolet illuminant 30 are mixed into white light; and wherein the wavelength of the generated blue light is within a wave band of 450~470 nm, and a wave crest of the generated blue light is located within the wave band excluding 460 nm.

As such, the red light, the green light and the blue light are generated by the quantum dot film 40 under excitation of ultraviolet light and are mixed into a desired white light; based on this, as shown in FIG. 3, by selecting a particular quantum dot material capable of generating blue light under excitation of ultraviolet light and controlling the particle size of the quantum dot material, the wave crest of the blue light generated by the quantum dot material is located within the blue light wave bands excluding 460 nm, thereby effectively attenuating or even eliminating the light intensity of the blue light having the wavelength of 460 nm and reducing damages of human eyes due to blue light, achieving a health design for electronic products.

Preferably, the wavelength of the blue light generated by the quantum dot film 40 under excitation of ultraviolet light emitted from the ultraviolet illuminant 30 is within a range of 450~470 nm and does not involve a wave band of 458~462 nm. As such, by eliminating the blue light within the wave band of 458~462 nm, damages of human eyes due to blue light can be reduced to the utmost extent.

In one example, the quantum dot film 40 may be a single-layered film, which includes quantum dot materials capable of respectively generating red light, green light and blue light under excitation of an ultraviolet light.

As such, the quantum dot film 40 formed by uniformly mixing the red light quantum dot material, the green light quantum dot material and the blue light quantum dot material may not only generate homogeneous light as it being emitted from the quantum dot film 40, but also the single-layered film has a relatively smaller thickness, which has relatively limited adverse influence on light transmittance, thereby obtaining homogeneous and high bright light.

Alternatively, the quantum dot film 40 may includes overlapped three layers. Each of the three layers includes one of the quantum dot materials capable of respectively generating the red light, the green light and the blue light under excitation of ultraviolet light, and light generated by the quantum dot materials of the three layers are different from one another.

Based on the above, a quantum dot film capable of generating the red light under excitation of ultraviolet light is formed by the red light quantum dot material, a quantum dot film capable of generating the green light under excitation of ultraviolet light is formed by the green light quantum dot material, a quantum dot film capable of generating the blue light under excitation of ultraviolet light is formed by the blue light quantum dot material, and the formed three quantum dot films are arranged to overlapped on one another. As such, when the ultraviolet light passes through the above three layers in turn so as to sequentially excite the quantum dot materials, the red light, the green light and the blue light are respectively generated and are mixed together to obtain a desired white light.

It is noted that the quantum dot film formed by the red light quantum dot material, the quantum dot film formed by the green light quantum dot material and the quantum dot film formed by the blue light quantum dot material are arranged to overlap on one another, and the stacking sequence of the three quantum dot films is not limited here.

Based on the above, the quantum dot materials capable of generating blue light under excitation of ultraviolet light may include CdTe quantum dot material, ZnSe quantum dot material, GaAs quantum dot material and the like. For various quantum dot materials, the wave band of the generated blue light may be controlled by selecting a particle size of a particular quantum dot material.

Based on the above description, with reference to FIG. 6, the quantum dots containing film 40 may be arranged on a light incidence side of a light guide plate 20'.

With the quantum dot film 40 arranged on the light incidence side of a light guide plate 20', light will become red light, green light and blue light before entering the light guide plate 20'; as such, the light may be mixed uniformly and sufficiently within the light guide plate 20' after having entered the light guide plate 20', so that light emitted from the light emitting face of the light guide plate 20' forms homogeneous white light.

Of course, the quantum dot film 40 may be also arranged on the light emitting side of the light guide plate 20', as shown in FIG. 8; in this instance, the red light quantum dot material, the green light quantum dot material and the blue light quantum dot material in the quantum dot film 40 may be controlled to be uniformly distributed, thereby facilitating uniformly mixing of light.

Alternatively, with reference to FIG. 7, when the backlight module is configured as a side-entrance backlight module, the ultraviolet illuminant 30 may be arranged on a light-incidence side of the light guide plate 20', and the quantum dot film 40 may be arranged on a side of the light guide plate 20' opposite to the light-incidence side. For example, an ultraviolet light LED and the quantum dot film 40 may be arranged on left and right sides of the light guide plate 20' respectively.

In such a case, a reflective film 60 is further arranged on a side of the quantum dot film 40 away from the light guide plate 20'. The reflective film 60 may be used to reflect the light reaching the quantum dot film 40 back into the light guide plate 20'.

The red light, the green light and the blue light can be generated only when the quantum dot film 40 is irradiated by the ultraviolet light, the generated light of different colors can be reflected by the reflective film 60 back into the light guide plate 20', and is uniformly mixed within the light guide plate 20'. In this instance, the guide plate 20' forms a homogeneous white light surface light source.

Further, the quantum dot film 40 may be arranged on a surface of an optical film sheet 50; wherein the optical film sheet 50 may include a diffusion sheet, a prism sheet and the like, and the quantum dot film 40 may be arranged on a light incidence side or a light emitting side of any sheet of the optical film sheet 50.

On the basis of this, the red light quantum dot material, the green light quantum dot material and the blue light quantum dot material in the quantum dot film 40 need to be controlled to be uniformly distributed.

An embodiment of the present disclosure further provides a display device, comprising the backlight module as described above.

Here, the display device may be a liquid crystal display device, which may comprise a liquid crystal panel and the backlight module as described above.

Based on the above, by using the backlight module according to embodiments of the present disclosure as a back light source of the liquid crystal panel, the light intensity of the blue light having the wavelength of 460 nm may be effectively attenuated or even eliminated, and damages of human eyes due to blue light are reduced, achieving a health design for electronic products.

Although several exemplary embodiments of the present disclosure have been shown and described, it would be appreciated by those skilled in the art that various changes or modifications may be made in these embodiments without departing from the principles and spirit of the present invention, the scope of which is defined in the claims and their equivalents.

What is claimed is:

1. An LED device, comprising an ultraviolet illuminant and a quantum dot film located on a light emitting side of the ultraviolet illuminant;
   the quantum dot film comprises a quantum dot material capable of generating red light, green light and blue light under excitation of ultraviolet light;
   wherein the wavelength of the generated blue light is within a wave band of 450~470 nm, and a wave crest of the generated blue light is located within the wave band excluding 460 nm.

2. The LED device according to claim 1, wherein the wavelength of the blue light generated by the quantum dot film under excitation of ultraviolet light emitted from the ultraviolet illuminant is within a range of 450~470 nm and does not involve a wave band of 458~462 nm.

3. The LED device according to claim 2, wherein
   the quantum dot film is arranged on a surface of the ultraviolet illuminant; or
   the LED device further comprises a lampshade covering the ultraviolet illuminant, and the quantum dot film is arranged on a surface of the lampshade.

4. The LED device according to claim 1, wherein the quantum dot film is a single-layered film, which comprises quantum dot materials capable of respectively generating the red light, the green light and the blue light under excitation of ultraviolet light.

5. The LED device according to claim 4, wherein
   the quantum dot film is arranged on a surface of the ultraviolet illuminant; or
   the LED device further comprises a lampshade covering the ultraviolet illuminant, and the quantum dot film is arranged on a surface of the lampshade.

6. The LED device according to claim 1, wherein the quantum dot film includes stacked three layers, each of the stacked three layer comprising one of quantum dot materials capable of respectively generating the red light, the green light and the blue light under excitation of ultraviolet light, and light generated by the quantum dot materials of the stacked three layers being different from one another in color.

7. The LED device according to claim 6, wherein
   the quantum dot film is arranged on a surface of the ultraviolet illuminant; or
   the LED device further comprises a lampshade covering the ultraviolet illuminant, and the quantum dot film is arranged on a surface of the lampshade.

8. The LED device according to claim 1, wherein
   the quantum dot film is arranged on a surface of the ultraviolet illuminant; or
   the LED device further comprises a lampshade covering the ultraviolet illuminant, and the quantum dot film is arranged on a surface of the lampshade.

9. A light guide plate, comprising a body and quantum dot particles distributed within the body;
   the quantum dot particles include quantum dot materials capable of generating red light, green light and blue light under excitation of ultraviolet light;
   the red light, green light and blue light generated by the quantum dot particles under excitation of ultraviolet light are mixed into a white light;

wherein the wavelength of the generated blue light is within a wave band of 450~470 nm, and a wave crest of the generated blue light is located within the wave band excluding 460 nm.

10. The light guide plate according to claim 9, wherein the wavelength of the blue light generated by the quantum dot particles under excitation of ultraviolet light is within a range of 450~470 nm and does not involve a wave band of 458~462 nm.

11. A backlight module, comprising an ultraviolet illuminant, a light guide plate and an optical film sheet;
the backlight module further comprises a quantum dot film located on a surface of the light guide plate or a surface of the optical film sheet;
the quantum dot film comprises quantum dot materials capable of generating red light, green light and blue light under excitation of ultraviolet light emitted from the ultraviolet illuminant;
the red light, green light and blue light generated by the quantum dot film under excitation of the ultraviolet light are mixed into white light; and
wherein the wavelength of the generated blue light is within a wave band of 450~470 nm, and a wave crest of the generated blue light is located within the wave band excluding 460 nm.

12. The backlight module according to claim 11, wherein the wavelength of the blue light generated by the quantum dot film under excitation of the ultraviolet light emitted from the ultraviolet illuminant is within the range of 450~470 nm and does not involve a wave band of 458~462 nm.

13. The backlight module according to claim 12, wherein
the quantum dot film is arranged on a light incidence side of the light guide plate; or,
when the backlight module is configured as a side-entrance backlight module, the ultraviolet illuminant is arranged on a light incidence side of the light guide plate, and the quantum dot film is arranged on a side of the light guide plate opposite to the light incidence side, wherein a reflective film is further arranged on a side of the quantum dot film away from the light guide plate.

14. The backlight module according to claim 11, wherein the quantum dot film is a single-layered film comprising quantum dot materials capable of respectively generating red light, green light and blue light under excitation of the ultraviolet light emitted from the ultraviolet illuminant.

15. The backlight module according to claim 14, wherein
the quantum dot film is arranged on a light incidence side of the light guide plate; or
when the backlight module is configured as a side-entrance backlight module, the ultraviolet illuminant is arranged on a light incidence side of the light guide plate, and the quantum dot film is arranged on a side of the light guide plate opposite to the light incidence side, wherein a reflective film is further arranged on a side of the quantum dot film away from the light guide plate.

16. The backlight module according to claim 11, wherein the quantum dot film includes stacked three layers, each of the stacked three layer comprising one of quantum dot materials capable of respectively generating the red light, the green light and the blue light under excitation of ultraviolet light, and light generated by the quantum dot materials of the stacked three layers being different from one another.

17. The backlight module according to claim 11, wherein
the quantum dot film is arranged on a light incidence side of the light guide plate; or,
when the backlight module is configured as a side-entrance backlight module, the ultraviolet illuminant is arranged on a light incidence side of the light guide plate, and the quantum dot film is arranged on a side of the light guide plate opposite to the light incidence side, wherein a reflective film is further arranged on a side of the quantum dot film away from the light guide plate.

* * * * *